(12) United States Patent
Liu

(10) Patent No.: US 11,812,569 B2
(45) Date of Patent: Nov. 7, 2023

(54) COUPLING ASSEMBLY AND DISPLAY TERMINAL

(71) Applicant: BEIJING XIAOMI MOBILE SOFTWARE CO., LTD., Beijing (CN)

(72) Inventor: Jianwei Liu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 17/521,609

(22) Filed: Nov. 8, 2021

(65) Prior Publication Data

US 2022/0346258 A1 Oct. 27, 2022

(30) Foreign Application Priority Data

Apr. 25, 2021 (CN) .......................... 202110449491.8

(51) Int. Cl.
| | | |
|---|---|---|
| *H05K 5/02* | (2006.01) | |
| *E05D 3/16* | (2006.01) | |
| *E05D 3/18* | (2006.01) | |
| *H05K 5/00* | (2006.01) | |

(52) U.S. Cl.
CPC ............. *H05K 5/0226* (2013.01); *E05D 3/16* (2013.01); *E05D 3/18* (2013.01); *H05K 5/0017* (2013.01)

(58) Field of Classification Search
CPC ...... H05K 5/0226; H05K 5/0018; E05D 3/16; E05D 3/18
See application file for complete search history.

(56) References Cited

U.S. PATENT DOCUMENTS

| | | | | |
|---|---|---|---|---|
| 10,365,691 | B2* | 7/2019 | Bae ....................... | G06F 1/1652 |
| 10,912,214 | B2* | 2/2021 | Kang ....................... | H05K 5/03 |
| 11,194,366 | B2* | 12/2021 | Cheng ................... | G06F 1/1652 |
| 11,268,565 | B2* | 3/2022 | Bae ........................ | F16C 11/04 |
| 11,336,759 | B2* | 5/2022 | Liao ....................... | G06F 1/1681 |
| 11,435,785 | B2* | 9/2022 | Song ...................... | G06F 1/1652 |
| 11,467,633 | B2* | 10/2022 | Liao ..................... | H04M 1/0268 |
| 11,516,932 | B2* | 11/2022 | Sim ...................... | H05K 5/0226 |

(Continued)

OTHER PUBLICATIONS

European Patent Application No. 21209070.8 extended Search and Opinion dated May 12, 2022, 12 pages.

(Continued)

*Primary Examiner* — Rockshana D Chowdhury
*Assistant Examiner* — Douglas R Burtner
(74) *Attorney, Agent, or Firm* — Cozen O'Connor

(57) ABSTRACT

A coupling assembly includes at least one support part. The support part includes: a first connector including a first cam and a first pin shaft, the first pin shaft being arranged on a side of the first cam; and a second connector including a support plate, a connection block and a support projection, the support projection having a support surface. The connection block has a pin hole with an aperture larger than an outer diameter of the first pin shaft in a predetermined plane parallel to the support plate; the first pin shaft is mounted in the pin hole; the first connector assumes a posture paralleling the predetermined plane, and the first cam is in contact with a first position of the support surface; the first connector assumes a posture intersecting the predetermined plane, and the first cam is in contact with a second position of the support surface.

20 Claims, 7 Drawing Sheets

(56) References Cited

U.S. PATENT DOCUMENTS

| | | | |
|---|---|---|---|
| 2013/0016492 A1* | 1/2013 | Wang | H05K 5/0226 |
| | | | 16/303 |
| 2015/0366089 A1* | 12/2015 | Park | G06F 1/1641 |
| | | | 361/679.01 |
| 2017/0115701 A1* | 4/2017 | Bae | G06F 1/16 |
| 2017/0227994 A1 | 8/2017 | Hsu | |
| 2020/0163239 A1* | 5/2020 | Yun | G09F 9/301 |
| 2020/0348732 A1* | 11/2020 | Kang | G06F 1/1652 |
| 2020/0409427 A1* | 12/2020 | Hsu | E05D 1/04 |
| 2021/0034117 A1* | 2/2021 | Torres | G06F 1/1616 |
| 2021/0120687 A1* | 4/2021 | Kim | E05D 11/02 |
| 2021/0271294 A1* | 9/2021 | Liao | H04B 1/3827 |
| 2021/0368032 A1* | 11/2021 | Liao | G06F 1/1681 |
| 2022/0068167 A1* | 3/2022 | Park | G06F 1/1616 |
| 2022/0075429 A1* | 3/2022 | Hazama | F16C 11/045 |
| 2022/0217859 A1* | 7/2022 | Lee | G06F 1/1652 |
| 2022/0316247 A1* | 10/2022 | Kim | E05D 11/105 |
| 2022/0361350 A1* | 11/2022 | Jung | H04M 1/0243 |
| 2023/0007797 A1* | 1/2023 | Jiang | H05K 5/0226 |
| 2023/0044949 A1* | 2/2023 | Park | H05K 5/0017 |
| 2023/0136116 A1* | 5/2023 | Kim | F16C 11/04 |
| | | | 361/807 |

OTHER PUBLICATIONS

Indian Patent Application No. 202144051756, Office Action dated Nov. 22, 2022, 5 pages.

\* cited by examiner

COUPLING ASSEMBLY AND DISPLAY TERMINAL

CROSS-REFERENCE TO RELATED APPLICATION

This application claims benefit of and priority to Chinese Patent Application Serial No. 202110449491.8, filed on Apr. 25, 2021, the entire contents of which are incorporated herein by reference.

TECHNICAL FIELD

The present disclosure generally relates to the field of electronic technology and, more particularly, to a coupling assembly and a display terminal.

BACKGROUND

With the development of electronic devices, coupling assemblies such as pivot and/or hinge structures are frequently used in foldable devices. The pivots or hinges may connect two separate parts, realizing a folded state and an unfolded state. The pivots, hinges and other coupling structures may connect two different areas of a flexible structure to allow the flexible structure to assume different postures when pulled by the pivots and hinges. Hence, the structural stability and functionality of the pivots, hinges and similar coupling structures may directly affect the overall performance and user experience of the foldable devices.

SUMMARY

Embodiments of the present disclosure provide a coupling assembly. The coupling assembly includes at least one support part. The at least one support part includes: a first connector including a first cam and a first pin shaft at an end, the first pin shaft being arranged on a side of the first cam; and a second connector including a support plate, a connection block and a support projection, the support projection having a support surface. The connection block is arranged side by side with the support projection, and has a pin hole with an aperture larger than an outer diameter of the first pin shaft in a predetermined plane parallel to the support plate; the first pin shaft is mounted in the pin hole; the support surface faces the first cam and interacts with the first cam; the first connector assumes a posture paralleling the predetermined plane, the first pin shaft is located on a first side of the pin hole, and the first cam is in contact with a first position of the support surface; the second connector assumes a posture intersecting the predetermined plane, the first pin shaft is on a second side of the pin hole, and the first cam is in contact with a second position of the support surface; the second side and the first side are opposite sides of the pin hole in the predetermined plane, and a distance between the first position and the support plate is greater than a distance between the second position and the support plate.

Embodiments of the present disclosure provide a display terminal. The display terminal includes: a coupling assembly. The coupling assembly includes at least one support part. The at least one support part includes: a first connector including a first cam and a first pin shaft at an end, the first pin shaft being arranged on a side of the first cam; and a second connector including a support plate, a connection block and a support projection, the support projection having a support surface. The connection block is arranged side by side with the support projection, and has a pin hole with an aperture larger than an outer diameter of the first pin shaft in a predetermined plane parallel to the support plate; the first pin shaft is mounted in the pin hole; the support surface faces the first cam and interacts with the first cam; the first connector assumes a posture paralleling the predetermined plane, the first pin shaft is located on a first side of the pin hole, and the first cam is in contact with a first position of the support surface; the second connector assumes a posture intersecting the predetermined plane, the first pin shaft is on a second side of the pin hole, and the first cam is in contact with a second position of the support surface; the second side and the first side are opposite sides of the pin hole in the predetermined plane, and a distance between the first position and the support plate is greater than a distance between the second position and the support plate. The display terminal also includes a foldable screen fixed to the first connector of the coupling assembly. When the first connector assumes the posture paralleling the predetermined plane, the foldable screen is unfolded; and when the second connector assumes the posture intersecting the predetermined plane, the foldable screen is folded.

BRIEF DESCRIPTION OF THE DRAWINGS

The drawings herein are incorporated into the specification and constitute a part of the specification, show embodiments consistent with the present disclosure, and together with the specification are used to explain the principles of the present disclosure.

DETAILED DESCRIPTION OF EMBODIMENTS

Figure 1:
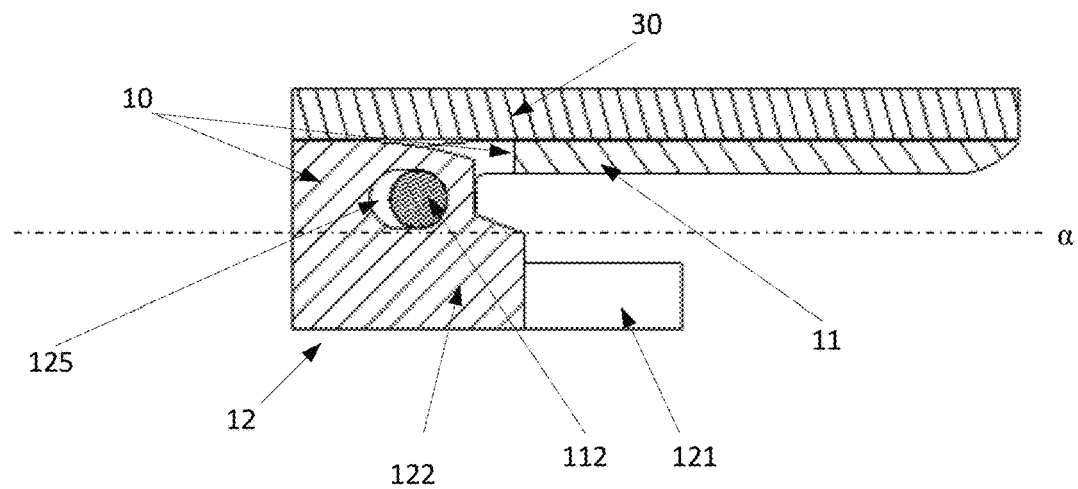
FIG. 1 is a schematic diagram of a support part of a coupling assembly according to an exemplary embodiment of the present disclosure.

Exemplary embodiments will be described in detail, with examples thereof illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure.

Instead, they are merely examples of devices consistent with aspects of the present disclosure as recited in the appended claims.

As illustrated in FIGS. 1-5, embodiments of the present disclosure provide a coupling assembly. The coupling assembly includes at least one support part 10. The support part 10 includes: a first connector 11 including a first cam 111 and a first pin shaft 112 at an end of the first connector, the first pin shaft 112 being arranged on a side of the first cam 111; and a second connector 12 including a support plate 121, a connection block 122 and a support projection 123, the support projection 123 having a support surface 124. The connection block 122 is arranged side by side with the support projection 123 and has a pin hole 125. The pin hole 125 has an aperture larger than an outer diameter of the first pin shaft 112 in a predetermined plane parallel to the support plate 121. The first pin shaft 112 is mounted in the pin hole 125. The support surface 124 faces the first cam 111 and interacts with the first cam 111. The first connector 11 assumes a posture paralleling the predetermined plane, the first pin shaft 112 is located on a first side of the pin hole 125, and the first cam 111 is in contact with a first position of the support surface 124. The second connector 12 assumes a posture intersecting the predetermined plane, the first pin shaft 112 is on a second side of the pin hole 125, and the first cam 111 is in contact with a second position of the support surface 124. The second side and the first side are opposite sides of the pin hole 125 in the predetermined plane. A distance between the first position and the support plate 121 is greater than a distance between the second position and the support plate 121. The predetermined plane herein is a plane parallel to the support plate 121.

The support part 10 is a structure for supporting a coupled object.

The first connector 11 may be plate-shaped or strip-shaped. The first connector 11 may be coupled to a portion of the object and provide the coupled portion with a traction force required for rotation and a support force for fixing a posture.

In embodiments of the present disclosure, the first connector 11 includes the first cam 111 at one end. The first cam 111 may include: a first cam 111 having an oval cross-section, or a first cam 111 having a main structure formed with a support projection 123. In short, in embodiments of the present disclosure, the first cam 111 may have various shapes, which will not be specifically limited herein.

In some embodiments of the present disclosure, the first pin shaft 112 is formed on the side of the first cam 111. The first pin shaft 112 may be a structure integrally formed with the first cam 111, i.e., the first cam 111 and the first pin shaft 112 may be cast and molded at the same time.

In other embodiments, the first cam 111 and the first pin shaft 112 may be separately fabricated and joined as a single piece by welding after fabrication.

The second connector 12 first provides the support plate 121 which may be a basic member of the second connector 12, and the connection block 122 and the support projection 123 are on the support plate 121. The connection block 122 and the support projection 123 are arranged side by side on the support plate 121.

In some embodiments, a height of the support projection 123 relative to the support plate 121 may be slightly smaller than a height of the connection block 122 relative to the support plate 121.

The connection block 122 has the pin hole 125 through which the first pin shaft 112 on the side of the first cam 111 of the first connector 11 passes after the first connector 11 is assembled with the second connector 12, and the first pin shaft 112 can rotate in the pin hole 125.

In some embodiments, the pin hole 125 is not a standard pin hole 125 with an outer diameter that adapts exactly to the first pin shaft 112. In some embodiments, the pin hole 125 may be a runway-shaped pin hole 125 or an oval pin hole 125.

The aperture of the pin hole 125 in the predetermined plane is larger than the outer diameter of the first pin shaft 112. In some embodiments, the first pin shaft 112 may be a first pin shaft 112 having a circular cross-section, and the aperture of the pin hole 125 in the predetermined plane may be larger than a diameter of the circular first pin shaft 112. In some embodiments, the first pin shaft 112 may also be a first pin shaft 112 with an irregular shape, in which case the aperture of the pin hole 125 in the predetermined plane is directly larger than a maximum outer diameter of the first pin shaft 112.

Since the aperture of the pin hole 125 in the predetermined plane is larger than the outer diameter of the first pin shaft 112, the first pin shaft 112 can not only rotate but also translate in the pin hole 125, so that a connection position between the first connector 11 and the second connector 12 changes, and the coupling assembly can be used for objects that need different connection spaces for connection.

In embodiments of the present disclosure, the predetermined plane is a plane parallel to the support plate. The aperture of the pin shaft 125 in the predetermined plane is larger than the maximum outer diameter of the first pin shaft 112, in which case the first pin shaft 112 can slide along the aperture.

In this way, when the second connector 12 and the first connector 11 are in different postures relative to each other, the first pin shaft 112 can move within the pin hole 125 and hence move between the first side and the second side of the pin hole 125 in the predetermined plane.

The second connector 12 is also provided with the support projection 123, and the support projection 123 has a support surface 124 inclined at a certain angle and facing the first cam 111. A contact position between the first cam 111 and the support surface 124 changes when the first connector 11 moves along a first direction. Since the support surface 124 is an inclined surface with respect to the support plate 121, a height of the support projection 123 raised by the support surface 124 is different.

In embodiments of the present disclosure, the first connector 11 assumes the posture paralleling the predetermined plane, which corresponds to an unfolded posture of two parts coupled by the coupling assembly. In such a case, the first pin shaft 112 of the first connector 11 is located in the pin hole 125 and at an end away from a center point of the support plate 121, and the first cam 111 is in contact with the first position of the support surface 124, which is a position closer to the support plate 121 than the second position, thereby allowing the two parts coupled by the coupling assembly to unfold more flat. When the first connector 11 assumes the posture intersecting the predetermined plane, the first cam 111 is in contact with the second position of the support surface 124, and the second position is a position with a greater distance from the support plate 121, i.e., a position closer to an apex of the support projection 123. When the first connector 11 is raised by the support surface 124 to a higher position, the parts coupled by the coupling assembly are supported by the first cam 111 at a downward-bent portion of the support projection 123.

As a result, the two parts coupled in embodiments of the present disclosure have enough space to unfold flat in the unfolded posture, and when folded, the two parts have sufficient support due to the movement of the first pin shaft 112 in the pin hole 125 and the first cam 111 raised higher by the support surface 124, which can reduce problems such as deformation due to insufficient support during long-term use.

Basic members such as the first pin shaft 112, the pin hole 125 and the first cam 111 used in embodiments of the present disclosure have characteristics of simple structure, high stability, and easy production.

In some embodiments, the support surface 124 has a first support point at a maximum distance from the support plate 121, and a second support point in contact with the support plate 121. A straight line passing through the first support point and the second support point intersects the predetermined plane.

The first support point is the apex of the support projection 123, and the second support point is a point where the support surface 124 intersects the support plate 121. In embodiments of the present disclosure, since the support surface 124 has a certain slope, a line connecting the first support point and the second support point intersects the first cam.

In some embodiments, the support surface 124 includes: an inclined surface facing the first cam 111 and interacting with the first cam 111, or a concave surface facing the first cam 111 and interacting with the first cam 111.

The inclined surface or the concave surface can form a structure with a drop in the distance between the first support point and the support surface 124 and between the second support point and the support surface 124, and can allow smooth movement of the first cam 111 of the first connector 11 along the inclined surface or the concave surface during the movement of the first connector 11 and the second connector 12.

In embodiments of the present disclosure, if the support surface 124 is the concave surface, an opening of the concave surface is oriented towards the first cam 111.

In other embodiments, the support surface 124 may be a convex surface, and it is sufficient that the highest point of the convex surface is equivalent to the first support point of the support surface 124.

As shown in FIGS. 4-7, the coupling assembly further includes a rotation part 20, and the rotation part 20 includes: a holder 21, a sliding rod 22 and a connection rod 23. Two support parts 10 are symmetrically distributed on both sides of the rotation part 20. The second connector 12 has a sliding groove 126. The sliding rod 22 has a first end rotatably coupled to the holder 21 and a second end inserted into the sliding groove 126, the second end being an end opposite to the first end. The connection rod 23 has a first end rotatably coupled to the holder 21 and a second end coupled to the connection block 122, the second end of the connection rod 23 being an end opposite to the first end of the connection rod 23. The connection block 122 approaches or gets away from the holder 21 when the connection rod 23 rotates.

In embodiments of the present disclosure, the rotation part 20 is a part that provides rotation desired by the coupled object. The rotation part 20 is transmissively coupled to the support part 10.

In embodiments of the present disclosure, the sliding rod 22 and the holder 21 may be coupled to each other by a rotation shaft, realizing relative rotation between the sliding rod 22 and the holder 21.

The sliding rod 22 may include two ends, one of which is called the first end and coupled to the holder 21, and the other of which is the second end and refers to a portion between the support plate 121 and the first connector 11. The second end is arranged in the sliding groove 126 provided in the second connector 12 and can slide in the sliding groove 126.

The sliding rod 22 moves in the sliding groove 126 and thus interacts with the first connector 11 at different positions, to push the first pin shaft of the first connector 11 to move between the first side and the second side of the pin hole 125.

The sliding groove 126 may be a linear sliding groove, and the sliding rod 22 is inserted through an opening on a side of the sliding groove 126 towards the holder 21. In some embodiments, a distance between the sliding groove 126 and the support plate 121 is smaller than a distance between the pin hole 125 and the support plate 121.

In some embodiments, the sliding groove 126 is a through groove, i.e., the sliding groove 126 is formed by a through-hole. The second end of the sliding rod 22 passes through the sliding groove 126. The second end of the sliding rod 22 passes through and is located outside the sliding groove 126 no matter how the sliding rod 22 moves relative to the connection block 122, such that separation of the connection block 122 and the sliding rod 22 can be inhibited.

In other embodiments, during the relative movement of the sliding rod 22 and the connection block 122, the second end of the sliding rod 22 may also enter the sliding groove 126, as long as it does not come out of the opening on the side of the sliding groove 126 towards the holder 21.

In order to achieve movement of the sliding rod 22 in the sliding groove 126, in embodiments of the present disclosure, the connection rod 23 is also included. The connection rod 23 is a rigid rod and can rotate relative to the holder 21. When the connection rod 23 rotates to different positions, a linear distance between the connection rod 23 and a plane where a center axis of the holder 21 is located changes, and the connection 23 drives the connection block 122 to move, achieving the relative movement of the sliding rod 22 and the connection block 122, and realizing an effect that the sliding rod 22 moves in the sliding groove 126.

In some embodiments, two connection rods 23 arranged outside a common rotation shaft 24 push the connection block 122 away from the holder 21 when unfolding relative to each other, and pull the connection block 122 close to the holder 21 when folded (i.e., collapsing).

When the two connection rods 23 unfold relative to each other, the coupling assembly unfolds and the coupled object fixed to the coupling assembly unfolds. When the two connection rods 23 collapse, the coupling assembly is folded and the coupled object fixed to the coupling assembly is folded.

One of the connection rods 23 is fixedly coupled to one of the connection blocks 122. In some embodiments, the fixed connection between the connection block 122 and the connection rod 23 can be achieved by means of a structure having the pin shaft and the pin hole 125, and the structure is simple and has high connection stability.

In one embodiment, the rotation part 20 further includes a rotation shaft 24 fixed to the holder 21; and the connection rod 23 has a first shaft hole and is located outside the rotation shaft 24 through the first shaft hole and can rotate around the rotation shaft 24.

The rotation shaft 24 may be fixed on a side of the holder 21. The first end of the connection rod 23 is coupled to the rotation shaft 24 through a shaft hole (i.e., the first shaft hole), so that the connection rod 23 can rotate around the holder 21.

In some embodiments, the connection rod 23 is an arbitrarily curved connection rod 23, i.e., a non-linear connection rod 23. In some embodiments, the connection rod 23 may be a two-segment rod 23. The connection rod 23 may include: a first connection rod segment and a second connection rod segment. The second connection rod segment is coupled to an end of the first connection rod segment and is at an obtuse angle to the first connection rod segment. The first connection rod segment has the first shaft hole.

The connection rods 23 adopts such a structure that when the coupling assembly is folded and unfolded, two connection rods 23 coupled to the same holder 21 collapse as much as possible. In some embodiments, a length of the first connection rod segment is smaller than a length of the second connection rod segment. With such a design, the first connection rod segment and the second connection rod segment may allow the two connection rods 23 coupled to the same holder 21 collapse as much as possible.

In some embodiments, the second end of the sliding rod 22 has a second pin shaft, the holder 21 has a second shaft hole, and the second pin shaft is inserted into the second shaft hole. Alternatively, the second end of the sliding rod 22 has a third shaft hole, the holder 21 has a third pin shaft, and the third pin shaft is inserted into the third shaft hole.

The sliding rod 22 and the holder 21 coupled in the above manner allows the sliding rod 22 to rotate relative to the holder 21.

In some embodiments, the sliding rod 22 has a second cam 221, and the first connector 11 has a sliding projection 113 facing the second cam 221. The second cam 221 interacts with the sliding projection 113 when rotating along with the sliding rod 22.

The interaction between the cam structure and the sliding projection 113 can push the first connector 11.

A surface of the sliding projection 113 facing the second cam 221 may be an inclined surface or a convex surface to achieve smoothness of the interaction between the second cam 221 and the sliding projection 113.

In some embodiments, the second cam 221 is located between the first end and the second end and outside the sliding groove 126. In some embodiments, the second cam 221 has an outer diameter greater than a width of the sliding groove 126 at the opening, to prevent the second cam 221 from being stuck in the sliding groove 126, and reduce anomalies during the movement of the coupling assembly.

Figure 2:
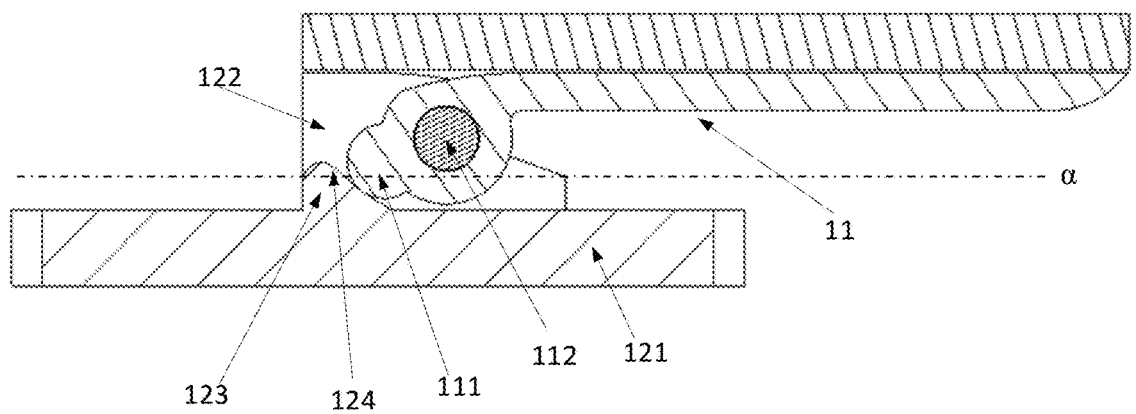
FIG. 2 is a schematic diagram of a support part of a coupling assembly according to an exemplary embodiment of the present disclosure.
Figure 3:
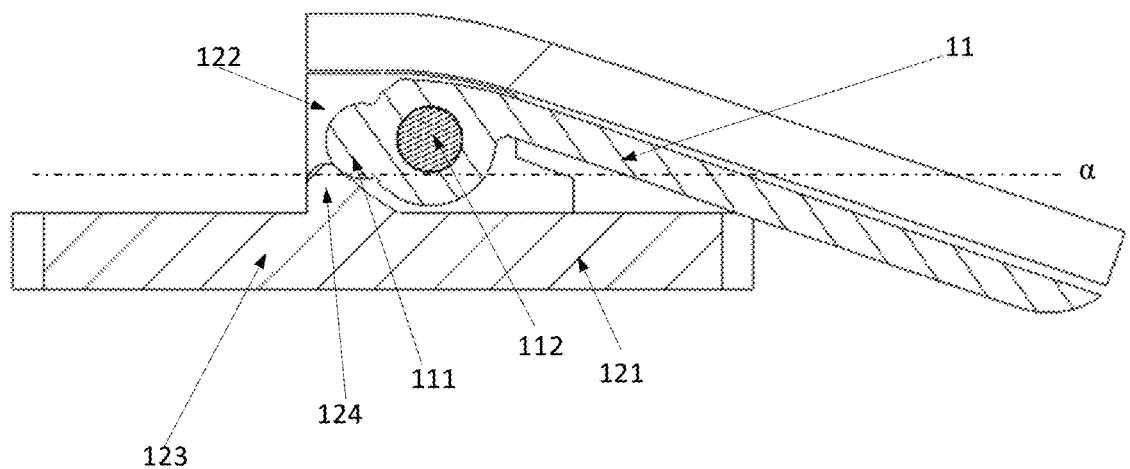
FIG. 3 is a schematic diagram of a support part of a coupling assembly according to an exemplary embodiment of the present disclosure.
Figure 4:
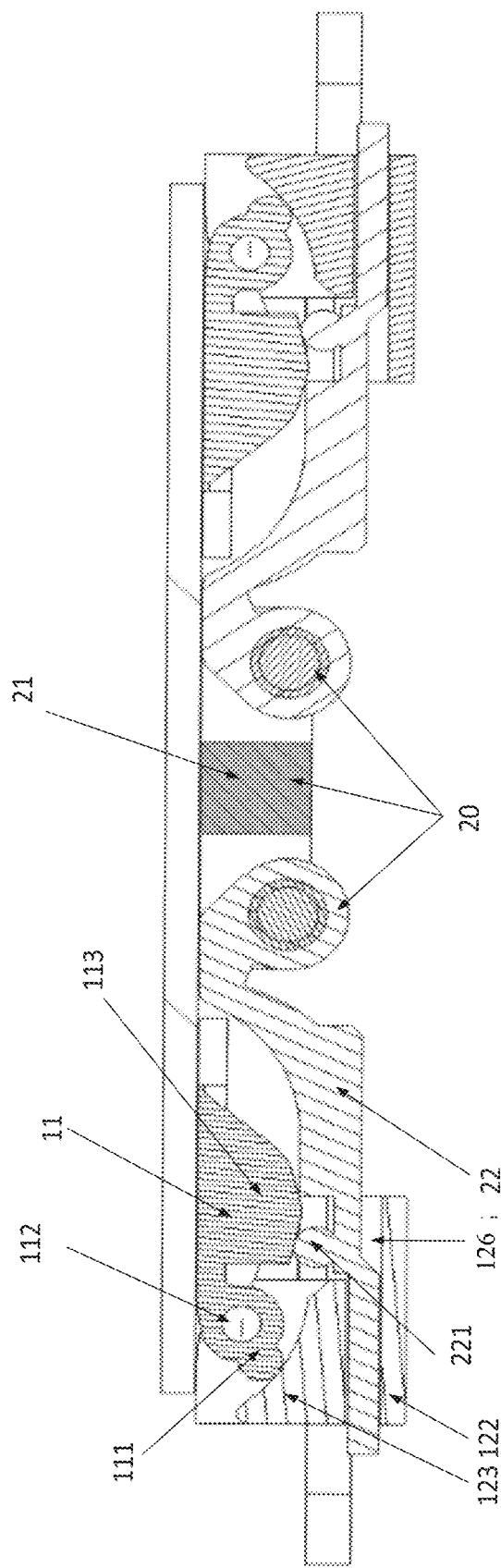
FIG. 4 is a schematic diagram of a coupling assembly according to an exemplary embodiment of the present disclosure.
Figure 5:
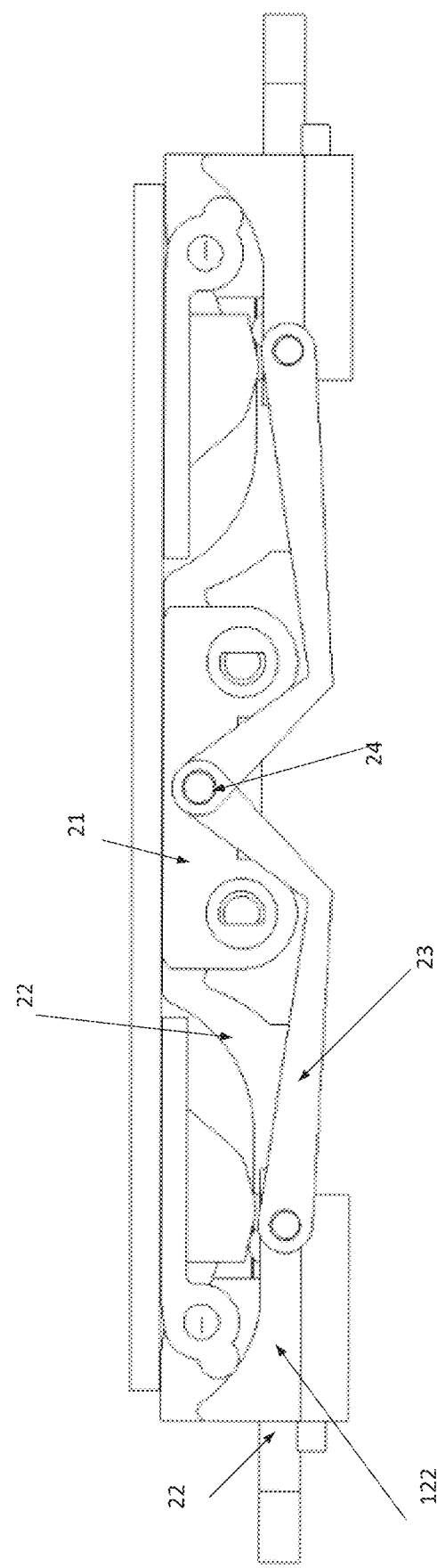
FIG. 5 is a schematic diagram of a coupling assembly according to an exemplary embodiment of the present disclosure.

As shown in FIGS. 1, 2 and 4, a display terminal according to embodiments of the present disclosure includes: the coupling assembly provided by any of the above technical solutions; and a foldable screen 30 fixed to a first connector 11 of the coupling assembly. When the first connector 11 assumes a posture paralleling a predetermined plane, the foldable screen is unfolded; and when the first connector 11 assumes a posture intersecting the predetermined plane, the foldable screen is folded.

A display terminal provided in embodiments of the present disclosure may include: a foldable screen having a foldable area, and the foldable screen may be a fully flexible screen or a partially flexible screen with a flexible foldable area.

In embodiments of the present disclosure, the foldable screen unfolds (i.e., the foldable screen is in an unfolded posture) when the first connector 11 assumes a posture paralleling the predetermined plane; and the foldable screen has a folding angle not equal to 0 degrees or 180 degrees (i.e., the foldable screen is folded) when the first connector 11 assumes a posture intersecting the predetermined plane.

In some embodiments, when the foldable screen is in a fully folded posture, a folding angle of the foldable screen may be 90 degrees.

In embodiments of the present disclosure, when the first connector 11 assumes the posture paralleling the predetermined plane, a distance between two first connectors 11 in a group of first connectors 11 is maximum, and the foldable screen has enough space to unfold flat, which can avoid wrinkles at a position where the coupling assembly is arranged, and reduce deformation of the foldable screen caused by such wrinkles. When the first connector 11 assumes the posture intersecting the predetermined plane, the distance between two first connectors 11 in the group of first connectors 11 is decreased, and the first cam 111 of either of the first connectors 11 supports the projection 123 in a direction facing away from the support plate 121, which can provide support for the foldable area of the foldable screen, prevent the foldable screen from collapsing for lack of support, and reduce unnecessary deformation of the screen due to long-term collapse, prolonging the service life of the foldable screen and upgrading user experience.

As shown in FIGS. 1 to 8, embodiments of the present disclosure propose a floating plate linkage structure based on a foldable hinge, which mainly includes a first connector 11, a connection block 122, and a first pin shaft 112. The first connector may be plate-shaped, and a plate-shaped portion of the first connector may be called a floating plate.

The floating plate is a plate structure for supporting a flexible screen, has holes, and is mounted to the connection block 122 by means of pins.

The connection block 122 has a sliding groove 126, and the first pin shaft 112 is rotatable and slidable in the sliding groove 126.

Meanwhile, the connection block 122 has a support surface 124 (or called a cam surface) which cooperates with the first cam 111 on the floating plate. In this way, the floating plate slides along with the cam surface during rotation.

The flexible screen is a foldable flexible display and has two ends bonded and fixed to the connection block 122 and the floating plate, respectively.

The connection block 122 has the sliding groove 126 for mounting a sliding rod 22, and the sliding rod 22 can slide linearly in the sliding groove 126 of the connection block 122. The sliding rod 22 has a hole at an end and is hinged to the holder 21 by means of the pin. The hinged connection here is one of the aforementioned rotatable connections.

The connection block 122 having a pin and the holder 21 having a pin are hinged to both ends of the connection rod 23. The hinged connection here is one of the aforementioned rotatable connections.

A middle portion of the sliding rod 22 has a second cam 221 that interacts with the cam surface on the floating plate. The cam surface here is a surface of the second cam interacts with the sliding projection 113.

When the connection block 122 is rotated, under the action of the connection rod 23, the connection block 122 slides relative to the sliding rod 22 while rotating. With the interaction of the cam and the sliding projection 113, the floating plate is deflected relative to the connection block 122.

Due to a tension effect of the screen itself, the first pin shaft 112 is pulled to slide in the sliding groove 126, making the screen naturally bend without being stretched.

Similarly, when the screen unfolds flat, the floating plate unfolds relative to the connection block 122 under the interaction of the second cam and the sliding projection 113.

Due to the interaction of the first cam and the support surface, the first pin shaft 112 slides, which allows the screen to fully unfold without wrinkles.

This structure is simple and reliable and has little difficulty in production and manufacturing. Moreover, problems such as wrinkles, stretches and deformation in a process of folding the screen folding process can be solved.

Figure 9:
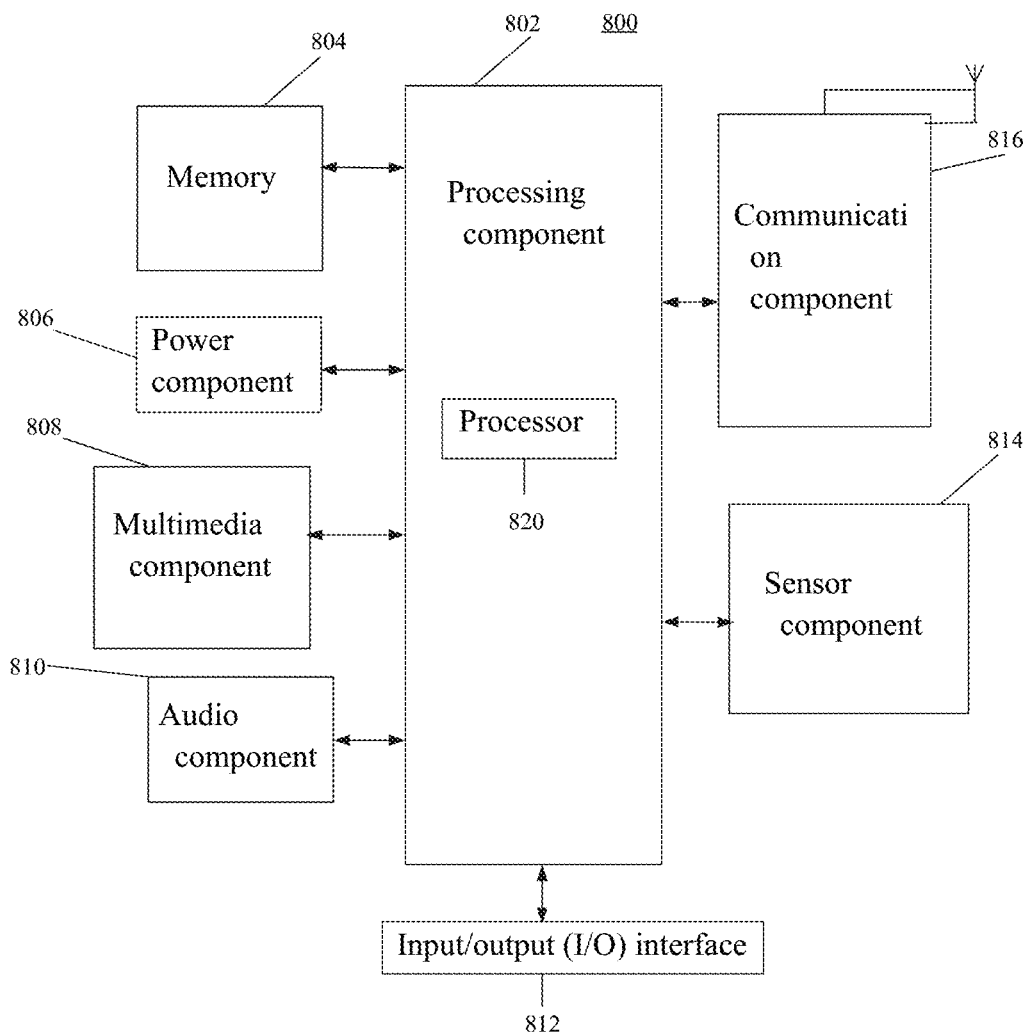
FIG. 9 is a schematic diagram of a UE structure according to an exemplary embodiment of the present disclosure.

FIG. 9 is a block diagram of a display device 800 according to an exemplary embodiment. For example, the display device 800 may be a mobile phone, a mobile computer, and other terminal devices or servers. In short, the display device 800 capable of data processing may be included in any kind of communication equipment.

Figure 6:
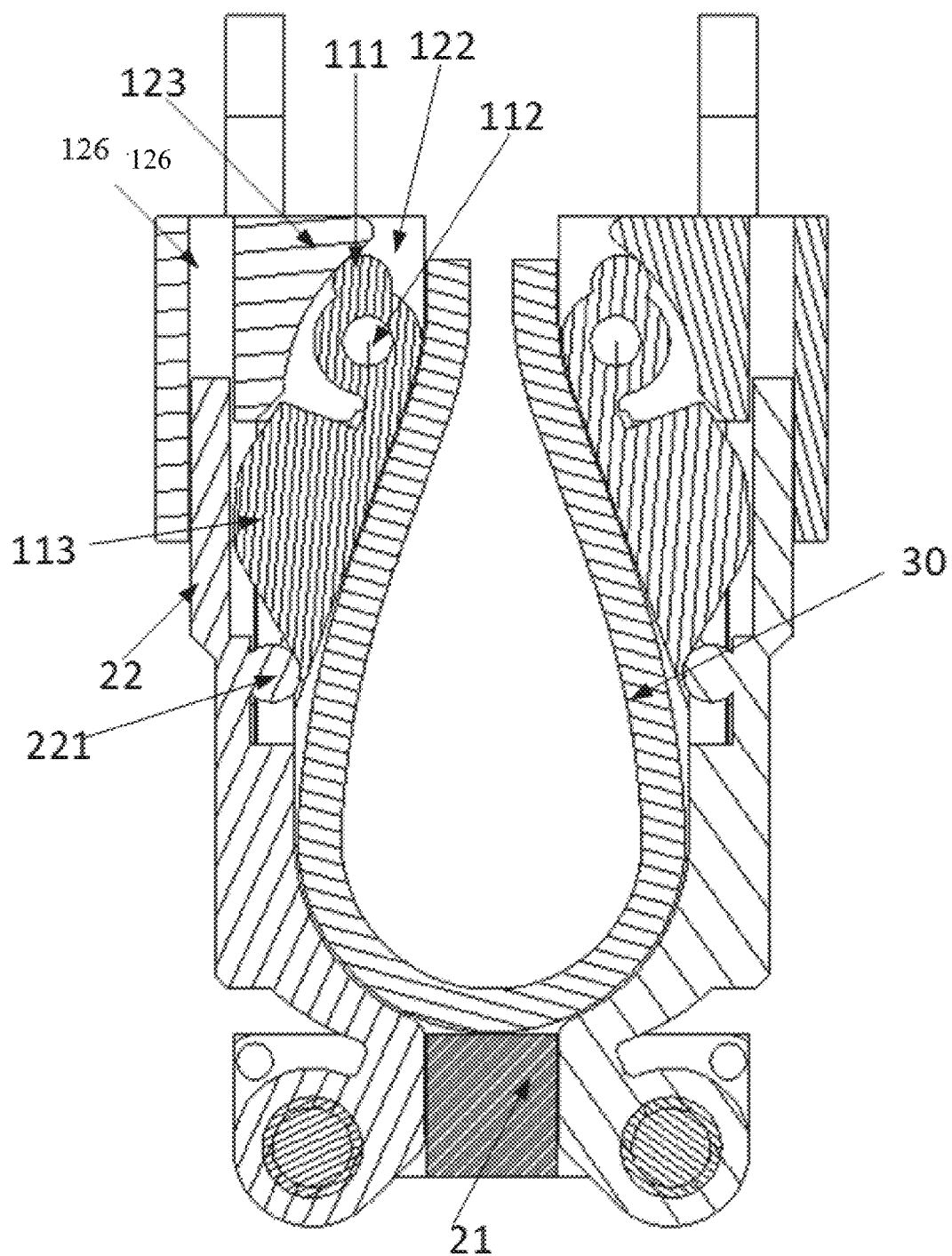
FIG. 6 is a schematic diagram of a coupling assembly according to an exemplary embodiment of the present disclosure.
Figure 7:
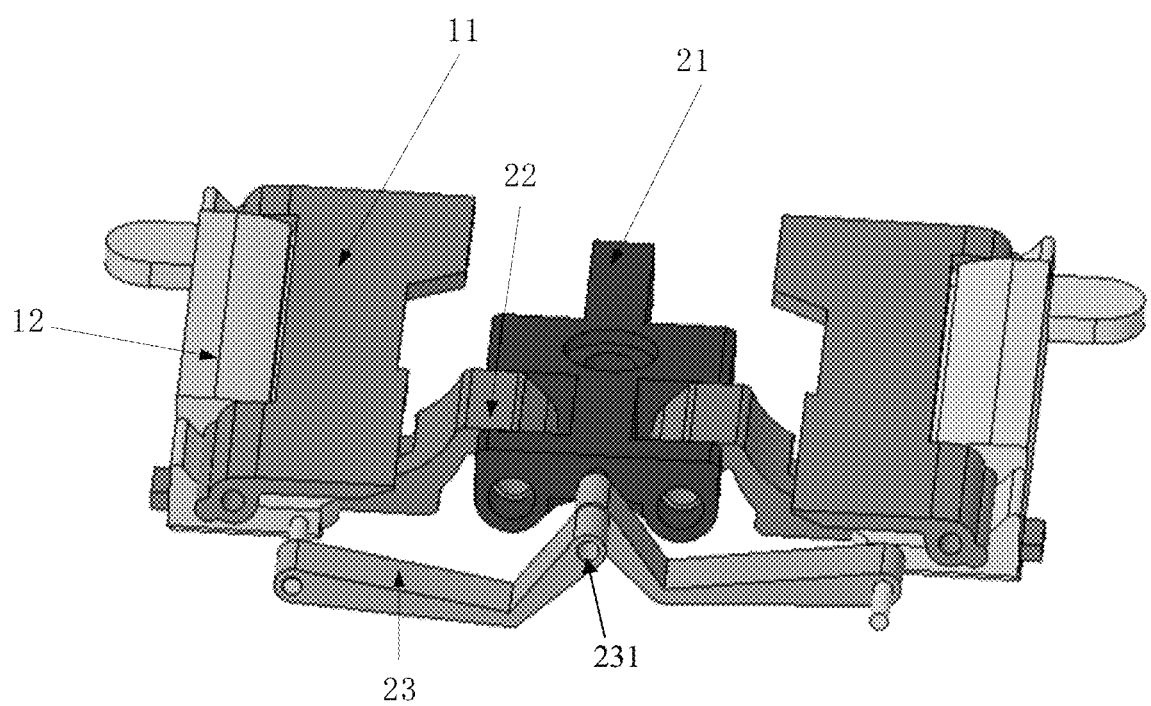
FIG. 7 is a schematic diagram of a coupling assembly according to an exemplary embodiment of the present disclosure.
Figure 8:
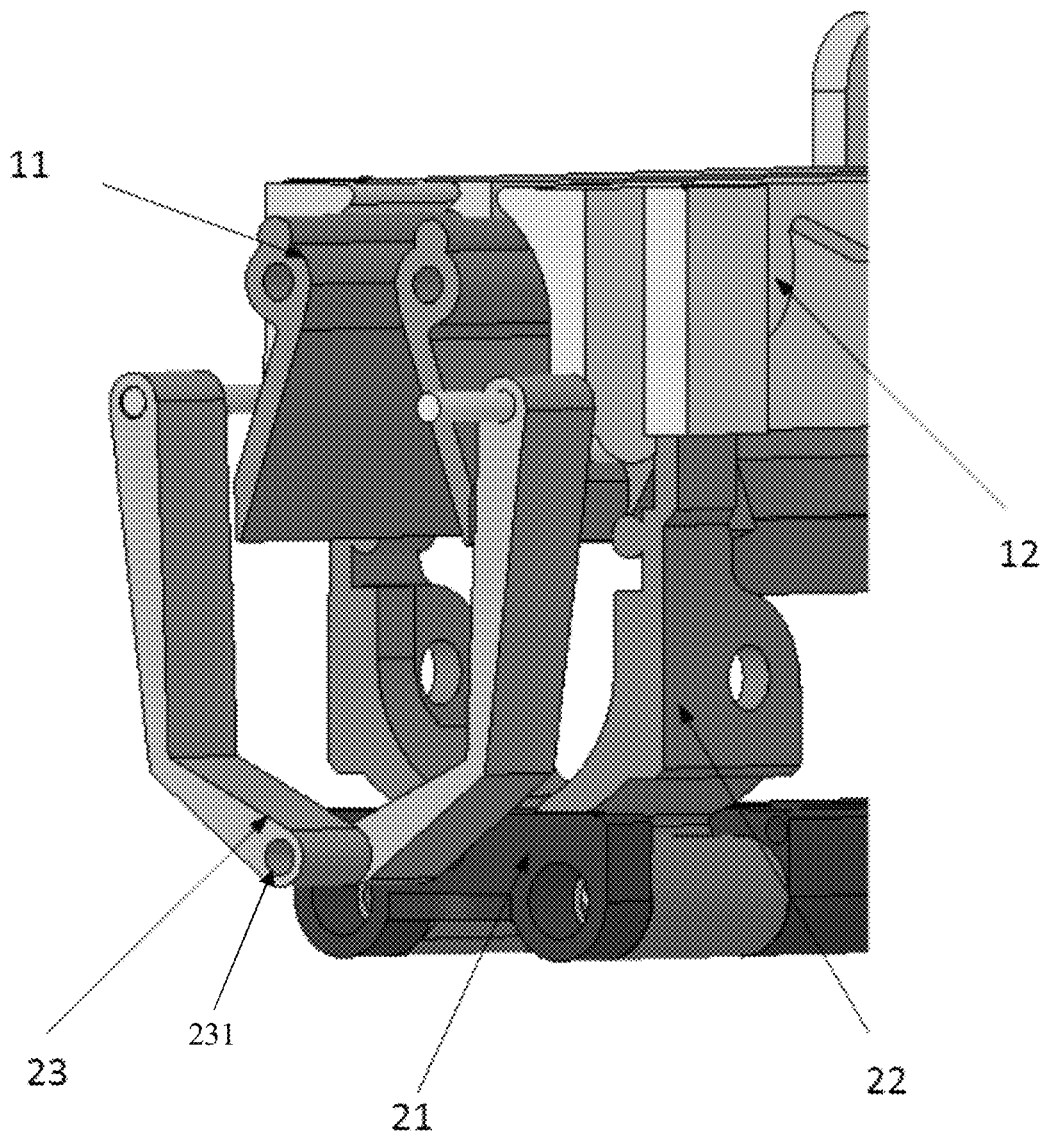
FIG. 8 is a schematic diagram of a coupling assembly according to an exemplary embodiment of the present disclosure.

Referring to FIG. 6, the display device 800 may include one or more of the following components: a processing component 802, a memory 804, a power component 806, a multimedia component 808, an audio component 810, an input/output (I/O) interface 812, a sensor component 814, and a communication component 816.

The processing component 802 typically controls overall operations of the display device 800, such as the operations associated with display, telephone calls, data communications, camera operations, and recording operations. The processing component 802 may include one or more processors 820 to execute instructions to perform all or part of the steps in the above described methods. Moreover, the processing component 802 may include one or more modules which facilitate the interaction between the processing component 802 and other components. For instance, the processing component 802 may include a multimedia module to facilitate the interaction between the multimedia component 808 and the processing component 802.

The memory 804 is configured to store various types of data to support the operation of the display device 800. Examples of such data include instructions for any applications or methods operated on the display device 800, contact data, phonebook data, messages, pictures, video, etc. The memory 804 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 806 provides power to various components of the display device 800. The power component 806 may include a power management system, one or more power sources, and any other components associated with the generation, management, and distribution of power in the display device 800.

The multimedia component 808 includes a screen providing an output interface between the display device 800 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 808 includes a front camera and/or a rear camera. The front camera and the rear camera may receive an external multimedia datum while the display device 800 is in an operation mode, such as a photographing mode or a video mode. Each of the front camera and the rear camera may be a fixed optical lens system or have focus and optical zoom capability.

The audio component 810 is configured to output and/or input audio signals. For example, the audio component 810 includes a microphone ("MIC") configured to receive an external audio signal when the display device 800 is in an operation mode, such as a call mode, a recording mode, and a voice recognition mode. The received audio signal may be further stored in the memory 804 or transmitted via the communication component 816. In some embodiments, the audio component 810 further includes a speaker to output audio signals.

The I/O interface 812 provides an interface between the processing component 802 and peripheral interface modules, such as a keyboard, a click wheel, buttons, and the like. The buttons may include, but are not limited to, a home button, a volume button, a starting button, and a locking button.

The sensor component 814 includes one or more sensors to provide status assessments of various aspects of the display device 800. For instance, the sensor component 814 may detect an open/closed status of the display device 800, relative positioning of components, e.g., the display and the keypad, of the display device 800, a change in position of the display device 800 or a component of the display device 800, a presence or absence of user contact with the display device 800, an orientation or an acceleration/deceleration of the display device 800, and a change in temperature of the display device 800. The sensor component 814 may include a proximity sensor configured to detect the presence of nearby objects without any physical contact. The sensor component 814 may also include a light sensor, such as a CMOS or CCD image sensor, for use in imaging applications. In some embodiments, the sensor component 814 may also include an accelerometer sensor, a gyroscope sensor, a magnetic sensor, a pressure sensor, or a temperature sensor.

The communication component 816 is configured to facilitate communication, wiredly or wirelessly, between the display device 800 and other devices. The display device 800 can access a wireless network based on a communication standard, such as WiFi, 2G, or 3G, or a combination thereof. In one exemplary embodiment, the communication component 816 receives a broadcast signal or broadcast associated information from an external broadcast management system via a broadcast channel. In one exemplary embodiment, the communication component 816 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In exemplary embodiments, the display device 800 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In exemplary embodiments, there is also provided a non-transitory computer-readable storage medium including instructions, such as included in the memory 804, executable by the processor 820 in the display device 800, for performing the above-described methods. For example, the non-transitory computer-readable storage medium may be a ROM, a RAM, a CD-ROM, a magnetic tape, a floppy disc, an optical data storage device, and the like.

Other embodiments of the present disclosure may be conceivable for those skilled in the art after considering the specification and practicing the technical solutions disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are regarded as exemplary only, and the true scope of the present disclosure are indicated by the following claims.

It should be understood that the present disclosure is not limited to the particular structures described above and shown in the drawings, and various modifications and changes can be made without departing from the scope of the present disclosure. The scope of the present disclosure is only limited by the appended claims.

What is claimed is:

1. A coupling assembly, comprising at least one support part,
wherein the at least one support part comprises:
a first connector comprising a first cam and a first pin shaft at an end, the first pin shaft being arranged on a side of the first cam; and
a second connector comprising a support plate, a connection block and a support projection, the support projection having a support surface,
wherein:
the connection block is arranged side by side with the support projection along a rotation axis of the first connector, and has a pin hole with an aperture larger than an outer diameter of the first pin shaft in a predetermined plane parallel to the support plate; the first pin shaft is mounted in the pin hole; the support surface faces the first cam and interacts with the first cam;
when the first connector assumes a posture paralleling the predetermined plane, the first pin shaft is located on a first side of the pin hole, and the first cam is in contact with a first position of the support surface;
when the first connector assumes a posture intersecting the predetermined plane, the first pin shaft is on a second side of the pin hole, and the first cam is in contact with a second position of the support surface;
the second side and the first side are opposite sides of the pin hole in the predetermined plane, and a distance between the first position and the support plate is greater than a distance between the second position and the support plate.

2. The coupling assembly according to claim 1, wherein:
the support surface has a first support point at a maximum distance from the support plate, and a second support point in contact with the support plate;
a straight line passing through the first support point and the second support point intersects the predetermined plane.

3. The coupling assembly according to claim 1, wherein the support surface comprises: at least one of an inclined surface and a concave surface facing the first cam and interacting with the first cam.

4. The coupling assembly according to claim 1, further comprising a rotation part,
wherein:
the rotation part comprises: a holder, a sliding rod, and a connection rod;
two support parts are symmetrically distributed on both sides of the rotation part;
the second connector has a sliding groove;
the sliding rod has a first end rotatably coupled to the holder and a second end inserted into the sliding groove, the second end being an end opposite to the first end;
the connection rod has a first end rotatably coupled to the holder and a second end coupled to the connection block, the second end of the connection rod being an end opposite to the first end of the connection rod; and
the connection block is configured to approach or gets away from the holder when the connection rod rotates.

5. The coupling assembly according to claim 4, wherein:
the rotation part further comprises a rotation shaft fixed to the holder; and
the connection rod has a first shaft hole, and is arranged outside the rotation shaft through the first shaft hole.

6. The coupling assembly according to claim 5, wherein the connection rod comprises:
a first connection rod segment having the first shaft hole; and
a second connection rod segment coupled to an end of the first connection rod segment and forming an obtuse angle with the first connection rod segment.

7. The coupling assembly according to claim 4, wherein:
the second end of the sliding rod has at least one of a second pin shaft and a third shaft hole;
the holder has at least one of a second shaft hole and a third pin shaft, correspondingly; and
the second pin shaft is inserted into the second shaft hole, or the third pin shaft is inserted into the third shaft hole.

8. The coupling assembly according to claim 4, wherein:
the sliding rod has a second cam, and the first connector has a sliding projection facing the second cam;
the second cam interacts with the sliding projection when rotating along with the sliding rod.

9. The coupling assembly according to claim 8, wherein the second cam is arranged between the first end and the second end and outside the sliding groove.

10. The coupling assembly according to claim 1, wherein the first connector is plate-shaped or strip-shaped.

11. The coupling assembly according to claim 1, wherein a height of the support projection relative to the support plate is smaller than a height of the connection block relative to the support plate.

12. The coupling assembly according to claim 2, wherein the support surface is a convex surface, and the highest point of the convex surface is equivalent to the first support point of the support surface.

13. The coupling assembly according to claim 8, wherein the sliding groove is a linear sliding groove, and the sliding rod is inserted through an opening on a side of the sliding groove towards the holder.

14. The coupling assembly according to claim 4, wherein a distance between the sliding groove and the support plate is smaller than a distance between the pin hole and the support plate.

15. The coupling assembly according to claim 4, wherein the sliding groove is a through groove, and the second end of the sliding rod passes through and is located outside the sliding groove.

16. The coupling assembly according to claim 8, wherein a surface of the sliding projection facing the second cam is an inclined surface or a convex surface.

17. The coupling assembly according to claim 13, wherein the second cam has an outer diameter greater than a width of the sliding groove at the opening of the sliding groove.

18. The coupling assembly according to claim 1, wherein the first pin shaft has an irregular shape, and the aperture of the pin hole in the predetermined plane is directly larger than a maximum outer diameter of the first pin shaft.

19. The coupling assembly according to claim 1, wherein the first pin shaft is integrally formed with the first cam.

20. A display terminal comprising:
- a coupling assembly, comprising at least one support part, wherein the at least one support part comprises:
- a first connector comprising a first cam and a first pin shaft at an end, the first pin shaft being arranged on a side of the first cam; and
- a second connector comprising a support plate, a connection block and a support projection, the support projection having a support surface, wherein:
- the connection block is arranged side by side with the support projection along a rotation axis of the first connector, and has a pin hole with an aperture larger than an outer diameter of the first pin shaft in a predetermined plane parallel to the support plate; the first pin shaft is mounted in the pin hole; the support surface faces the first cam and interacts with the first cam;
- when the first connector assumes a posture paralleling the predetermined plane, the first pin shaft is located on a first side of the pin hole, and the first cam is in contact with a first position of the support surface;
- when the first connector assumes a posture intersecting the predetermined plane, the first pin shaft is on a second side of the pin hole, and the first cam is in contact with a second position of the support surface;
- the second side and the first side are opposite sides of the pin hole in the predetermined plane, and a distance between the first position and the support plate is greater than a distance between the second position and the support plate; and
- a foldable screen fixed to the first connector of the coupling assembly,
- wherein when the first connector assumes the posture paralleling the predetermined plane, the foldable screen is unfolded; and when the second connector assumes the posture intersecting the predetermined plane, the foldable screen is folded.

* * * * *